United States Patent
Nakayama et al.

(10) Patent No.: US 8,014,202 B2
(45) Date of Patent: Sep. 6, 2011

(54) NON-VOLATILE SEMICONDUCTOR MEMORY DEVICE

(75) Inventors: Masayoshi Nakayama, Shiga (JP);
Kazuyuki Kouno, Osaka (JP); Reiji Mochida, Osaka (JP); Hoshihide Haruyama, Kyoto (JP)

(73) Assignee: Panasonic Corporation, Osaka (JP)

( * ) Notice: Subject to any disclaimer, the term of this patent is extended or adjusted under 35 U.S.C. 154(b) by 98 days.

(21) Appl. No.: 12/489,870

(22) Filed: Jun. 23, 2009

(65) Prior Publication Data
US 2010/0027352 A1 Feb. 4, 2010

(30) Foreign Application Priority Data
Jul. 31, 2008 (JP) ................................. 2008-197571

(51) Int. Cl.
*G11C 11/34* (2006.01)
*G11C 16/04* (2006.01)

(52) U.S. Cl. ......... 365/185.11; 365/185.17; 365/185.29; 365/210.1; 365/185.16

(58) Field of Classification Search ............. 365/185.11, 365/185.17, 185.29, 210.1, 185.16
See application file for complete search history.

(56) References Cited

U.S. PATENT DOCUMENTS

| | | | |
|---|---|---|---|
| 6,781,897 B2* | 8/2004 | Dvir et al. | 365/200 |
| 7,183,608 B2 | 2/2007 | Huang et al. | |
| 7,206,241 B2 | 4/2007 | Kido et al. | |
| 7,573,745 B2* | 8/2009 | Maayan et al. | 365/185.17 |
| 7,692,960 B2* | 4/2010 | Chen et al. | 365/180 |
| 2004/0008541 A1 | 1/2004 | Maayan et al. | |
| 2009/0116286 A1* | 5/2009 | Chong et al. | 365/185.13 |
| 2009/0116287 A1* | 5/2009 | Ou et al. | 365/185.13 |

FOREIGN PATENT DOCUMENTS
JP 2004-039233 A 2/2004
* cited by examiner

*Primary Examiner* — Amir Zarabian
*Assistant Examiner* — Kretelia Graham
(74) *Attorney, Agent, or Firm* — McDermott Will & Emery LLP (57) ABSTRACT

In a non-volatile semiconductor memory device, variations in voltage applied to a bit line when an erase voltage applying step is repeatedly executed are suppressed, thereby reducing variations in Vt after erasure. A memory array includes memory cells arranged in an array, a plurality of word lines, and a plurality of bit lines and main bit lines. The memory array also includes a usable region which can store data and an isolation region which cannot store data. Each bit line provided in the usable region is connected via a select transistor to the corresponding main bit line. At least one main bit line is connected not only to a bit line of the usable region, but also to a bit line of the isolation region via a select transistor.

8 Claims, 6 Drawing Sheets

NON-VOLATILE SEMICONDUCTOR MEMORY DEVICE

CROSS REFERENCE TO RELATED APPLICATIONS

This application claims priority under 35 U.S.C. §119(a) on Patent Application No. 2008-197571 filed in Japan on Jul. 31, 2008, the entire contents of which are hereby incorporated by reference.

BACKGROUND

The present disclosure relates to a non-volatile semiconductor memory device including a memory array having a plurality of memory cells, in which the memory array is divided into isolated groups in a bit-line direction, and each memory cell is of, for example, a MONOS type that the cell stores data by locally accumulating charge.

Non-volatile semiconductor memory devices in which a batch of data can be simultaneously electrically erased are characterized in that stored information is not lost even when the device is not powered ON. A variety of arrangements have been proposed for such a kind of non-volatile semiconductor memory devices. In recent years, attention has been attracted by a memory array in which MONOS memory cells which store data by locally accumulating charge are arranged using a virtual ground. This is partly because this technique relatively easily enables each memory cell to store two-bit data.

In this technique, a select transistor is generally provided for each erase unit so as to prevent a voltage from being applied to a bit line for an erase unit which is not to be erased. This means that a large number of select transistors need to be provided so as to increase the erase granularity. Therefore, a layout area for providing the select transistors is increased, disadvantageously leading to an increase in area of the memory array.

In order to solve this problem, a technique of improving the erase granularity without providing a select transistor has been proposed in which a memory array is divided into a plurality of bit line groups, where an isolation region is provided between each bit line group (Patent Document 1).

Figure 4:
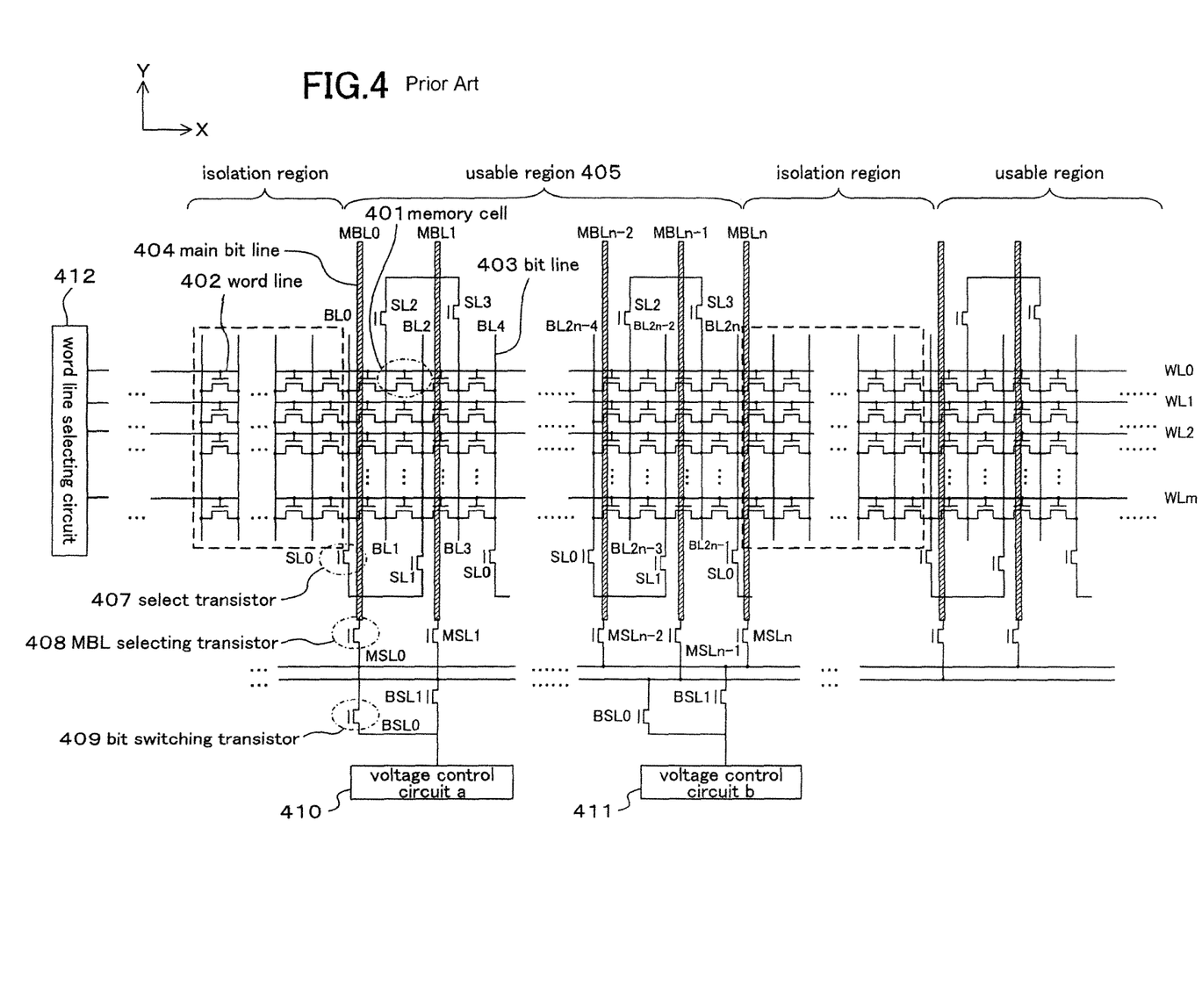
FIG. 4 is a diagram showing a memory array arrangement of a conventional non-volatile semiconductor memory device.

FIG. 4 is a diagram showing an example memory array arrangement of a conventional non-volatile semiconductor memory device.

Read operation in the arrangement of FIG. 4 will be described. Here, it is assumed that a memory cell 401 is connected to WL0 of word lines 402 and BL1 and BL2 of bit lines 403, and data stored on the BL2 side thereof is read out.

Initially, a word line selecting circuit 412 applies a read voltage to WL0 while applying 0 V to the other word lines.

In addition, a read drain voltage is applied to BL1 while a read source voltage is applied to BL2, where the read drain voltage is higher than the read source voltage. As a result, data can be read out, depending on the amount of a current passing through the memory cell 401 (the current amount depends on a charge accumulated state on the BL2 side). In this case, a voltage control circuit a 410 generates the read drain voltage, and a voltage control circuit b 411 generates the read source voltage. Also, BSL0 is selected from bit switching transistors 409, MSL0 and MSL1 are selected from MBL selecting transistors 408, and SL0 and SL1 are selected from select transistors 407.

Conversely, when data stored on the BL1 side is read out, the source voltage is applied to BL1 while the drain voltage is applied to BL2. This is achieved by selecting BSL1 from the bit select transistors 409. The MBL selecting transistors 408 and the select transistors 407, and the word lines 402 are selected in manners similar to those when data on the BL2 side is read out.

Next, write operation in the arrangement of FIG. 4 will be described. Here, it is assumed that, as is similar to the read operation, attention is paid to the memory cell 401 which is connected to WL0 of the word lines 402 and BL1 and BL2 of the bit lines 403, and data is to be stored on the BL2 side thereof by locally accumulating charge.

Initially, the word line selecting circuit 412 applies a write voltage to WL0 while applying 0 V to the other word lines 402.

In addition, 0 V is applied to BL1 while a high voltage is applied to BL2. As a result, a current passes through the memory cell 401, so that charge is accumulated on the BL2 side by channel hot electrons, whereby data can be written. In this case, the voltage control circuit a 410 generates 0 V while the voltage control circuit b 411 generates a voltage Vdp+ ΔVdp. The term ΔVdp represents a voltage including a voltage drop across a bit switching transistor 409, an MBL selecting transistor 408 and a select transistor 407 of a current passing through a memory cell during write operation, and a voltage drop due to a resistance of a main bit line 404. In addition, BSL0 is selected from the bit switching transistors 409, MSL0 and MSL1 are selected from the MBL selecting transistors 408, and SL0 and SL2 are selected from the select transistors 407.

After application of the write voltage, program verification is executed to determine whether or not a predetermined Vt has been reached. When the predetermined Vt has not been reached, a voltage is applied again. When the predetermined Vt has been reached, the voltage application is stopped. Thus, the write operation is completed.

Conversely, when data is written to the BL1 side, Vdp is applied to BL1 while 0 V is applied to BL2. This is achieved by selecting BSL1 from the bit select transistors 409. The MBL selecting transistors 408 and the select transistors 407, and the word lines 402 are selected in manners similar to those when data is written to the BL2 side.

Next, erase operation will be described. In a non-volatile semiconductor memory device in which a batch of data can be simultaneously electrically erased, a predetermined number of bits (1 Mb, etc.) are simultaneously erased as an erase unit. A case where data is erased from memory cells 401 in a usable region 405 provided between two isolation regions in the arrangement of FIG. 4, will be described.

Initially, before start of erasure, write operation is executed with respect to data in the erased state within an erase unit to provide a uniform Vt within the erase unit (preprogramming step). Thereafter, an erase voltage generated by the voltage control circuit b 411 is applied to a bit line 403 to inject hot holes occurring between the bit line 403 and a substrate into an area in which electric charge is locally accumulated, thereby neutralizing the electric charge locally accumulated on the bit line side of each memory cell 401. As a result, data is erased.

In this case, an erase voltage Vde is normally applied to either of two bit lines 403 connected to memory cells 401, but not to both of them. The other bit line is not electrically connected (HiZ state).

As the number of bit lines to which a voltage is simultaneously applied increases, a time required for erasure advantageously decreases. However, this number is limited by a current caused by a current passing through a memory cell (hereinafter referred to as "Ie") during erasure and a current capability (hereinafter referred to as "Ipp") of the voltage control circuit b 411 which is used to apply a voltage to a bit line. In order to increase the number of bit lines to which a voltage is simultaneously applied, the Ipp of the voltage control circuit b 411 needs to be increased, which leads to an increase in chip area.

Therefore, in order to achieve a chip having a small area, it is necessary to reduce the number of bit lines to which a voltage is simultaneously applied, i.e., to divide bit lines into a plurality of groups in an erase unit and apply an erase voltage to the groups separately. Specifically, the following expression needs to be satisfied:

$$Ipp > Ie \times i$$

where i represents the number of bit lines to which a voltage is simultaneously applied.

Figures 5A, 5B:
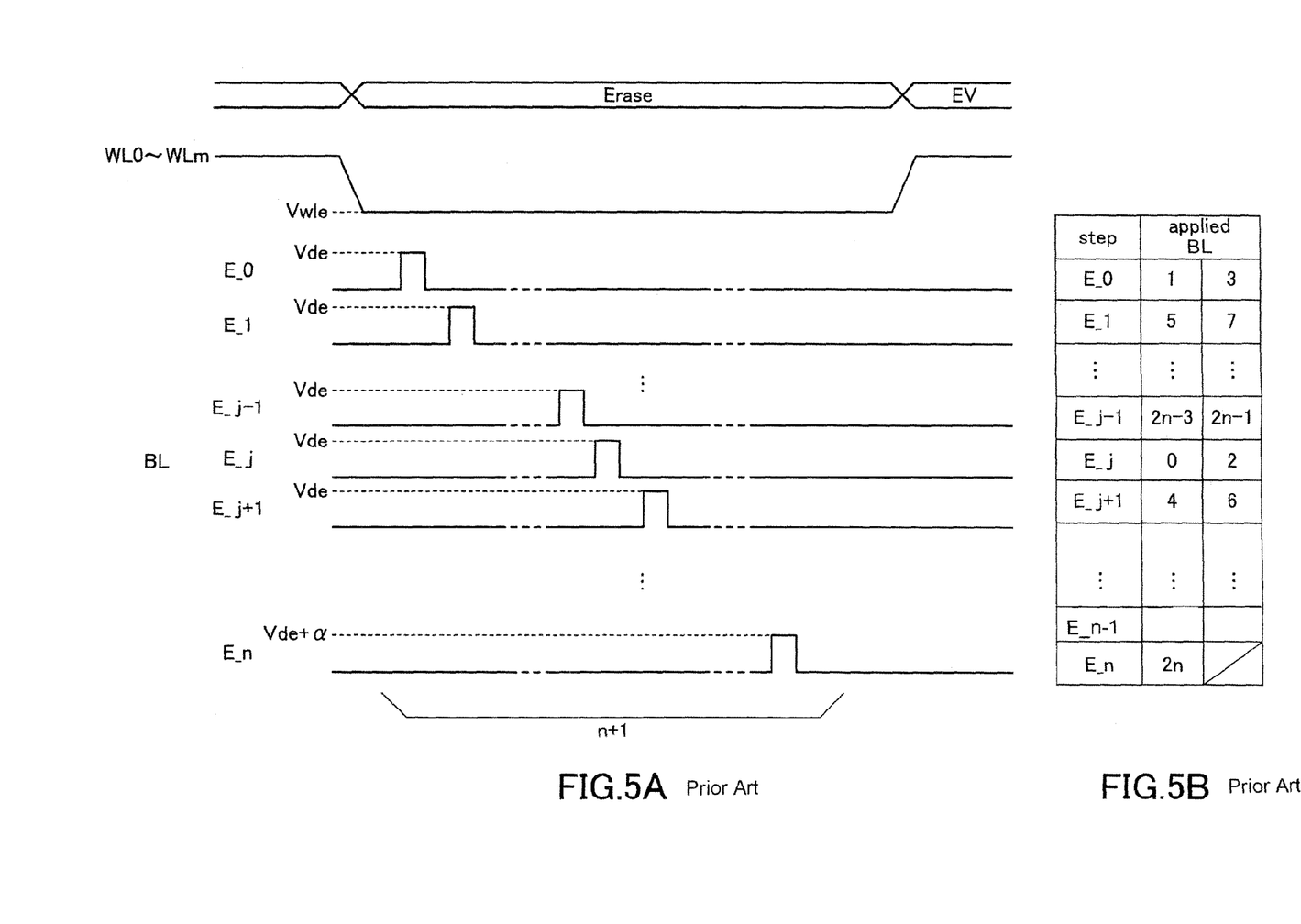
FIG. 5A is a diagram showing timings of application of a voltage to word lines and bit lines in conventional erase operation.
FIG. 5B is a diagram showing bit lines to which an erase voltage is applied in each step.

For example, erase operation in a case where the number i of bit lines to which a voltage is simultaneously applied is two, will be described with reference to FIGS. 5A and 5B. FIG. 5A is a diagram showing timings of application of a voltage to word lines 402 and bit lines 403 when the erase operation is executed with respect to the usable region 405. FIG. 5B is a diagram showing bit lines to which an erase voltage is applied at each timing.

Initially, the word line selecting circuit 412 applies an erase voltage Vwle to the word lines 402 (WL0 to WLm).

Thereafter, the voltage control circuit b 411 generates a voltage Vde+ΔVde. The term ΔVde represents a voltage including a voltage drop across a bit switching transistor 409, an MBL selecting transistor 408 and a select transistor 407 of a current passing through memory cells in the erase operation, and a voltage drop due to a resistance of a main bit line 404. In addition, BSL0 is selected from the bit switching transistors 409, MSL1 is selected from the MBL selecting transistors 408, and SL0 and SL1 are selected from the select transistors 407. Therefore, the erase voltage Vde is applied to BL1 and BL3 of the bit lines 403. As a result, electric charge locally accumulated on the BL1 and BL3 sides of the memory cells 401 connected to BL1 and BL3 is neutralized (step E_0).

Next, the selected MBL selecting transistor 408 is changed from MSL1 to MSL3, so that the erase voltage Vde is applied to BL5 and BL7 of the bit lines 403. As a result, electric charge locally accumulated on the BL5 and BL7 sides of the memory cells 401 connected to BL5 and BL7 is neutralized (step E_1).

Thereafter, a similar control is repeatedly executed while changing the selected MBL selecting transistor 408, until MSLn−1 is selected (step E_j−1).

Thereafter, the bit switching transistor is changed from BSL0 to BSL1, MSL0 is selected from the MBL selecting transistors 408, and SL0 and SL1 are selected from the select transistors 407. As a result, BL0 and BL2 are selected from the bit lines 403 (step E_j).

Thereafter, a similar control is repeatedly executed while changing the selected MBL selecting transistor 408, until MSLn is selected (step E_n).

After a series of erase voltage applications, erasure verification is executed to determine whether or not the predetermined Vt has been reached. When the predetermined Vt has not been reached, a series of erase voltage applications are executed again. When the predetermined Vt has been reached, the voltage application is stopped. Thus, the erase operation is completed.

Patent Document 1: Japanese Unexamined Patent Application Publication No. 2004-039233

SUMMARY

In the erase voltage applying steps of the aforementioned erase operation, the number of bit lines to which a voltage is simultaneously applied is two in steps E_0 to E_n−1, while the number of bit lines to which a voltage is simultaneously applied is one in step E_n.

Accordingly, a current passing through a bit switching transistor 409, an MBL selecting transistor 408 and a main bit line 404 in steps E_0 to E_n−1 is twice as much as a currently passing through a bit switching transistor 409, an MBL selecting transistor 408 and a main bit line 404 in step E_n. Therefore, the amount of a voltage drop across a current path differs between steps E_0 and E_n−1 and step E_n. Specifically, as shown in FIG. 5A, the voltage Vde is applied to the two bit lines in steps E_0 to E_n−1, while a higher voltage Vde+α is applied to the single bit line BL2n in step E_n.

As a result, when erase operation is executed, only data on the BL2n side of memory cells connected to the bit line BL2n is erased to the deep Vt. This leads to erroneous determination during read operation caused by a leakage current between bit lines due to over-erasure, or a deterioration in reliability characteristics due to a decrease in resistance to repetitive write operation.

It would also be considered that step E_n is removed, and in step E_n−1, a voltage is applied to BL2n in addition to BL2n−4 and BL2n−2, i.e., a total of three bit lines. In this case, however, the voltage applied to the bit lines in step E_n−1 is lower than that in steps E_0 to E_n−2, and therefore, a similar problem arises.

Alternatively, it would be considered that this problem is avoided by executing erasure verifying operation for each bit line to which an erase voltage is applied, and stopping subsequent application of the erase voltage to a bit line for which it is determined that erasure has been completed, thereby suppressing erasure to the deep Vt after erasure. However, this technique leads to an increase in chip area due to an increase in control circuit, an increase in erasure time due to an increase in the number of times of transition in erase voltage application and erasure verifying operation.

As described above, when an erase voltage is applied to a bit line in a plurality of steps of erase operation, the voltage applied to the bit line varies from step to step, disadvantageously leading to occurrence of over-erasure or the like.

An object of the present disclosure is to provide a non-volatile semiconductor memory device having a memory array arrangement and erase operation, in which variations in a voltage applied to a bit line during repetitive execution of an erase voltage applying step can be suppressed, thereby reducing variations in Vt after erasure.

In the present disclosure, in order to suppress variations in a voltage applied to a bit line during repetitive execution of an erase voltage applying step, an erase voltage can be applied to a portion of bit lines in an isolation region for isolating usable regions from each other. Moreover, in erase operation with respect to a usable region, a bit line of an isolation region to which the erase voltage is applied is appropriately selected so that the number of bit lines to which the erase voltage is applied is constant.

Specifically, according to an embodiment of the present disclosure, a non-volatile semiconductor memory device comprising a memory array is provided. The memory array includes a plurality of non-volatile memory cells arranged in an array extending in X and Y directions, for storing data by locally accumulating electric charge, a plurality of word lines extending in the X direction in a region where the plurality of non-volatile memory cells are provided, and a plurality of bit lines and a plurality of main bit lines extending in the Y direction in the region where the plurality of non-volatile memory cells are provided. The memory array includes one or more usable regions which can store data in accordance with an address signal input from an outside of the non-volatile semiconductor memory device, and one or more isolation regions which cannot store data in accordance with an address signal input from an outside of the non-volatile semiconductor memory device. The one or more isolation regions are arranged in parallel to a bit-line direction, isolating the one or more usable regions from each other. Each of the plurality of bit lines provided in the one or more usable regions is connected via a select transistor to the corresponding main bit line. At least a first main bit line of the plurality of main bit lines is connected via a select transistor to a first isolation region bit line of the bit lines of the one or more isolation regions in addition to the corresponding bit line of the one or more usable regions.

According to the present disclosure, an erase voltage can be applied to a portion of the bit lines of the isolation regions for isolating the usable regions from each other. Therefore, in erase operation with respect to a usable region, a bit line of an isolation region to which the erase voltage is applied is appropriately selected so that the number of bit lines to which the erase voltage is applied is constant. As a result, variations in voltage applied to a bit line in each erase voltage applying step can be suppressed, thereby avoiding a problem, such as occurrence of over-erasure or the like.

Moreover, in the non-volatile semiconductor memory device of this embodiment, erase operation of the usable region preferably includes an erase voltage applying step of applying a voltage to the bit lines of the usable region, and an erasure verifying step of verifying that a desired erased state is achieved, after the erase voltage applying step. The erase voltage applying step preferably includes executing simultaneous application of the voltage to two or more bit lines a plurality of times while changing the applied bit line. At least one of the plurality of times of the voltage application is preferably to apply the voltage to the first isolation region bit line in addition to the corresponding bit line of the usable region.

According to the present disclosure, variations in voltage applied to a bit line in each erase voltage applying step can be suppressed, thereby avoiding a problem, such as occurrence of over-erasure or the like. Therefore, variations in Vt after erasure can be reduced, thereby achieving a more reliable non-volatile semiconductor memory device.

DETAILED DESCRIPTION

First Embodiment

Figure 1:
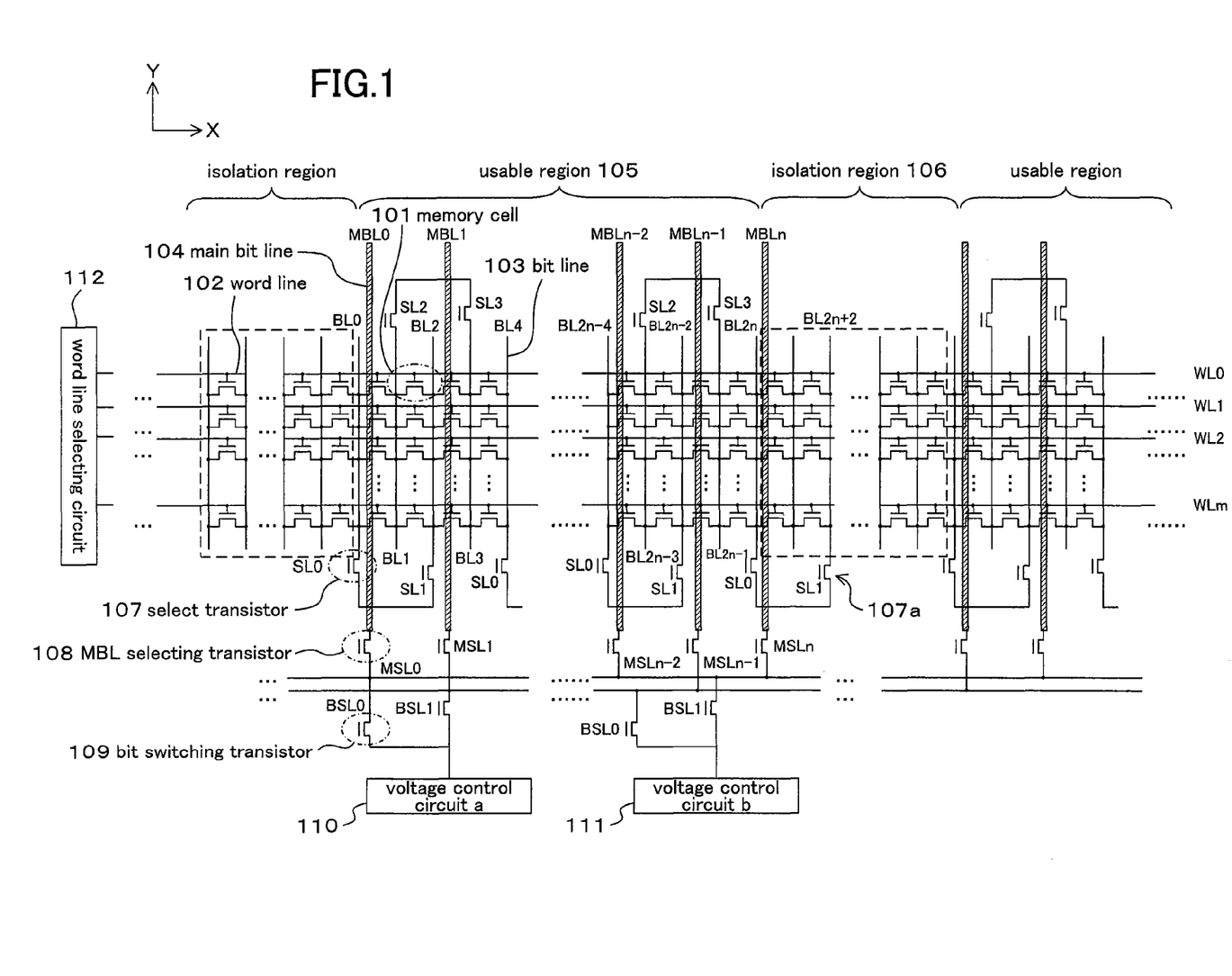
FIG. 1 is a diagram showing a memory array arrangement of a non-volatile semiconductor memory device according to a first embodiment.

FIG. 1 is a diagram showing a memory array arrangement of a non-volatile semiconductor memory device according to a first embodiment of the present disclosure. In FIG. 1, the memory array includes: a plurality of MONOS memory cells 101 which are arranged in an array extending in X and Y directions and each of which stores data by locally accumulating electric charge; a plurality of word lines 102 which are arranged in a region where the memory cells 101 are provided, extending in the X direction; and a plurality of bit lines 103 which are arranged in the region where the memory cells 101 are provided, extending in the Y direction. Data is stored into a memory cell 101 by locally injecting electric charge into both of two bit lines 103 connected to the memory cell 101.

In the memory array, the memory cells 101, the word lines 102 and the bit lines 103 are configured using a virtual ground technique. The word lines 102 (a total of (m+1) word lines WL0 to WLm in FIG. 1) are connected to a word line selecting circuit 112.

The memory array is also divided into usable regions for storing data and isolation regions for isolating each usable region, in the bit-line direction. Each usable region includes $2n$ columns of memory cells 101 and $2n+1$ bit lines 103. Also in each usable region, a plurality of main bit lines 104 are arranged, extending in the Y direction. Each bit line 103 in the usable region is connected via one of the main bit lines 104 via a select transistor 107. For example, bit lines BL0 to BL$2n$ and main bit lines MBL0 to MBLn are provided in a usable region 105 (first usable region).

Also, in each isolation region, memory cells 101 are provided which have a configuration similar to that of those provided in the usable regions. A portion of bit lines 103 are connected to main bit lines provided in an adjacent usable region via select transistors. For example, in an isolation region 106 (first isolation region), a bit line BL$2n+2$ (first isolation region bit line) is connected to the main bit line MBLn (first main bit line) of the usable region 105 via a select transistor 107a (SL1).

Read operation and write operation in the memory array arrangement of FIG. 1 are similar to those in the memory array arrangement of FIG. 4 and therefore will not be described.

Figure 2A:
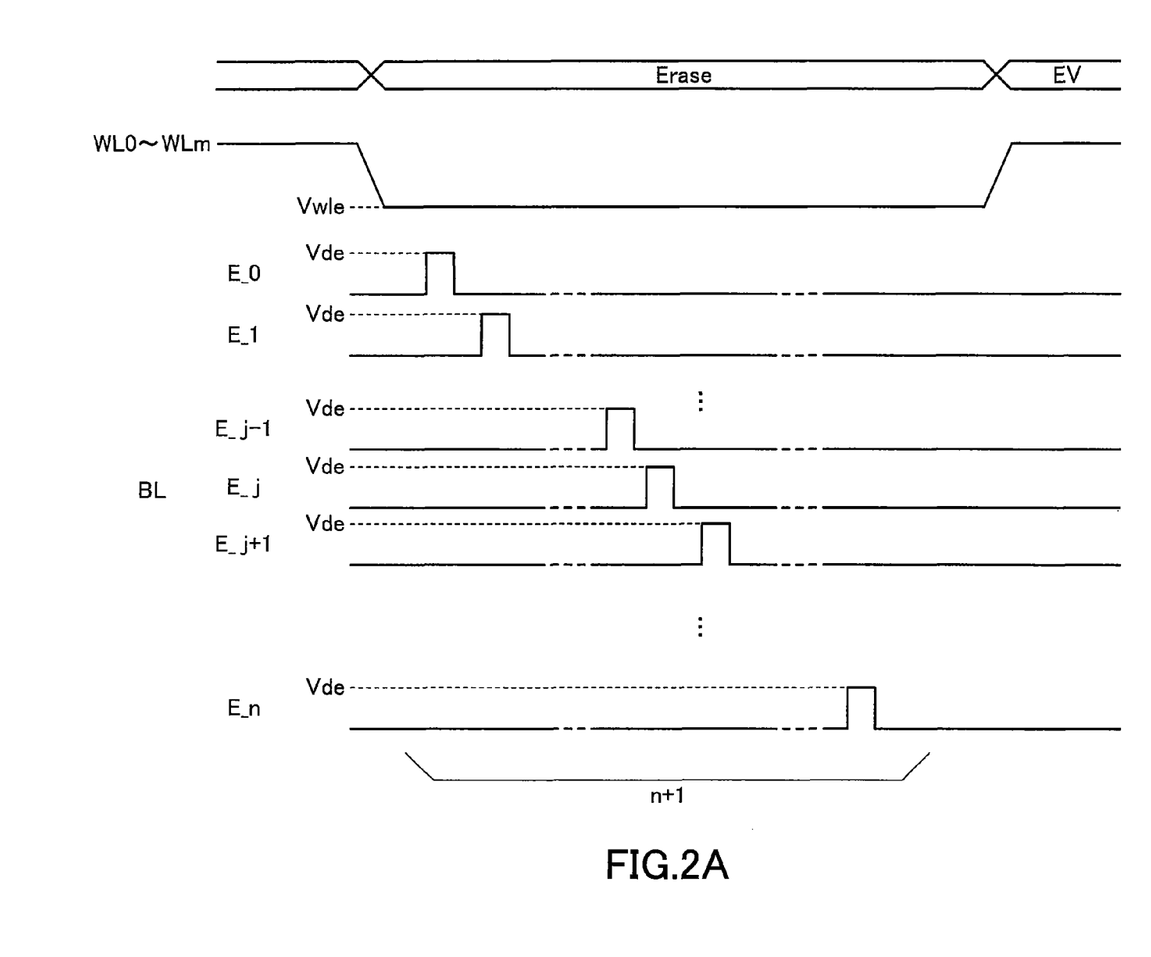
FIG. 2A is a diagram showing timings at which a voltage is applied to word lines and bit lines in erase operation of this embodiment.
Figure 2B:
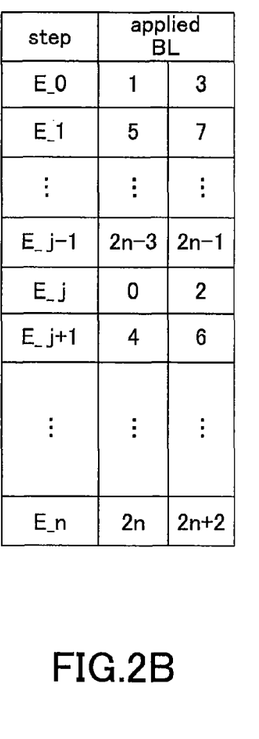
FIG. 2B is a diagram showing bit lines to which the erase voltage is applied in each step of FIG. 2A.

Erase operation in the memory array arrangement of FIG. 1 will be described with reference to FIGS. 2A and 2B. FIG. 2A is a diagram showing timings at which a voltage is applied to word lines and bit lines in the erase operation of this embodiment. FIG. 2B is a diagram showing bit lines to which the erase voltage is applied at each timing (erase voltage applying steps E_0 to E_n).

Note that it is here assumed that the erase voltage is applied to two bit lines in each erase voltage applying step. It is also assumed that the erase operation is executed with respect to the usable region 105.

Initially, before start of erasure, write operation is executed with respect to data in the erased state within an erase unit to provide a uniform Vt within the erase unit (preprogramming step (pre-erasure write operation). See, FIG. 6). Thereafter, an erase voltage Vwle is applied to the word lines 102 (WL0 to WLm) by the word line selecting circuit 112.

Figure 6:
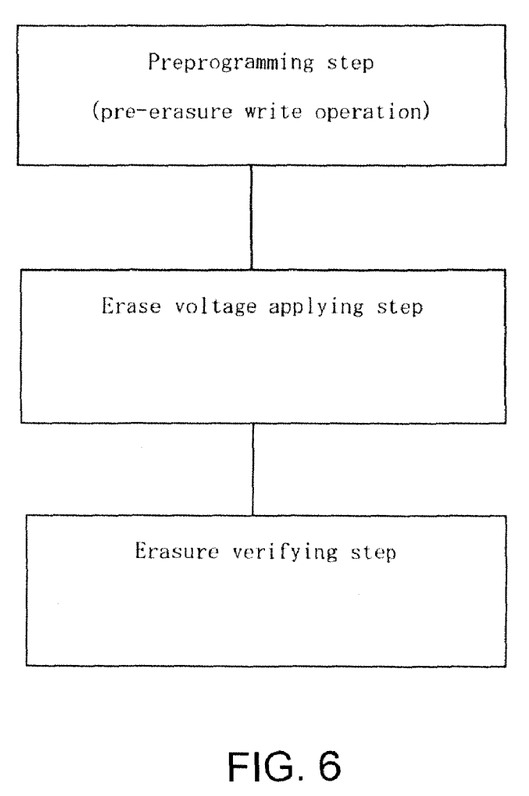
FIG. 6 is a flowchart showing the erase operation of the first embodiment.

Thereafter, the erase voltage applying steps E_0 to E_n of applying the erase voltage to bit lines 103 of the usable region 105 are executed while changing bit lines as shown in FIG. 2B and FIG. 6. In this case, a voltage control circuit b 111 generates a voltage (Vde+ΔVde), where Vde represents the erase voltage, and ΔVde represents a voltage including a voltage drop across a bit switching transistor 109, an MBL selecting transistor 108 and a select transistor 107 of a current Ie passing through memory cells 101 during erasure, and a voltage drop due to a resistance of a main bit line 104.

Initially, BSL0 is selected from bit switching transistors 109, MSL1 is selected from MBL selecting transistors 108, and SL2 and SL3 are selected from select transistors 107. Therefore, the erase voltage Vde is applied to BL1 and BL3 of the bit lines 103 (step E_0). As a result, electric charge which is locally accumulated on the BL1 and BL3 sides of the memory cells 101 connected to the bit lines BL1 and BL3, is neutralized.

Next, the selected bit switching transistor 109 and select transistor 107 are not changed, and the selected MBL selecting transistor 108 is changed from MSL1 to MSL3. Therefore, the erase voltage Vde is applied to BL5 and BL7 of the bit lines 103 (step E_1). As a result, electric charge which is locally accumulated on the BL5 and BL7 sides of the memory cells 101 connected to the bit lines BL5 and BL7, is neutralized.

Thereafter, similar operation is executed while changing the selected MBL selecting transistor 108 (until step E_j−1). In step E_j−1, when the selected MBL selecting transistor 108 is changed to MSLn−1, the erase voltage Vde is applied to BL2n−3 and BL2n−1 of the bit lines 103.

Thereafter, the bit switching transistor 109 is changed from BSL0 to BSL1. Also, MSL0 is selected from the MBL selecting transistors 108, and SL0 and SL1 are selected from the select transistors 107. As a result, the erase voltage Vde is applied to BL0 and BL2 of the bit lines 103 (step E_j).

Thereafter, similar operation is executed while changing the selected MBL selecting transistor 108 (until step E_n). In step E_n, when the selected MBL selecting transistor 108 is changed to MSLn, the erase voltage Vde is applied to BL2n of the bit lines 103.

Also in step E_n, the erase voltage Vde is also applied to the bit line BL2n+2 of the isolation region 106 via the main bit line MBLn, the MBL selecting transistor MSLn and the select transistor 107a (SL1).

After the erase voltage applying steps E_0 to E_n, erasure verification is executed to determine whether or not the predetermined Vt has been reached (see, FIG. 6). When the predetermined Vt has not been reached, the erase voltage applying steps E_0 of E_n are executed again. When the predetermined Vt has been reached, the erase voltage application is stopped. Thus, the erase operation is completed.

Here, in this embodiment, in step E_n, when the erase voltage is applied to the bit line BL2n of the usable region 105, the erase voltage is also simultaneously applied to the bit line BL2n+2 of the isolation region 106. Therefore, in each of the erase voltage applying steps E_0 to E_n, the erase voltage is applied to two bit lines (i.e., a constant number of bit lines). As a result, an erase current can also be caused to be close to 2Ie in step E_n, whereby variations in erase voltage applied to each bit line can be suppressed.

Second Embodiment

Figure 3:
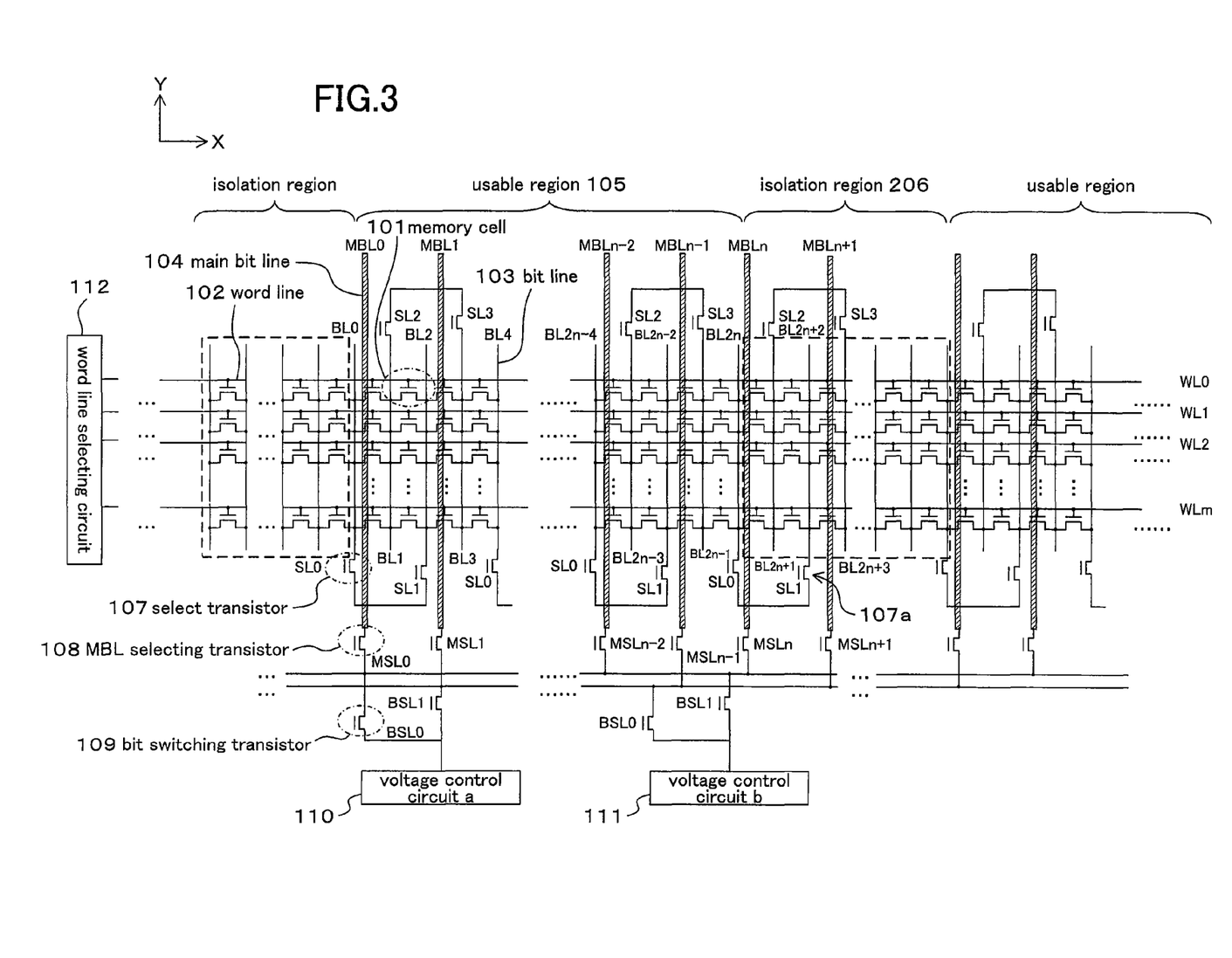
FIG. 3 is a diagram showing a memory array arrangement of a non-volatile semiconductor memory device according to a second embodiment of the present disclosure.

FIG. 3 is a diagram showing a memory array arrangement of a non-volatile semiconductor memory device according to a second embodiment of the present disclosure. In FIG. 3, components similar to those of FIG. 1 are indicated by the same reference symbols and will not be described in detail.

The arrangement of FIG. 3 is slightly different from that of FIG. 1 in the isolation region. Specifically, as is similar to the arrangement of FIG. 1, a portion of bit lines 103 are connected to main bit lines provided in an adjacent usable region via select transistors, and in addition, write operation and read operation can be executed with respect to a plurality of memory cells connected to the portion of the bit lines 103.

For example, in an isolation region 206 (first isolation region), a bit line BL2n+2 is connected to a main bit line MBLn provided in a usable region 105 via a select transistor 107a (SL1). Also, in the isolation region 206, a main bit line MBLn+1 (isolation region main bit line) is provided. The main bit line MBLn+1 is connected to bit lines BL2n+1 and BL2n+3 (second and third isolation region bit lines) connected to a plurality of memory cells 101 connected to the bit line BL2n+2, via respective select transistors. A write voltage and a read voltage can be applied from the main bit line MBLn provided in the usable region 105 to the bit line BL2n+2. A write voltage and a read voltage can also be applied from the main bit line MBLn+1 provided in the isolation region 206 to the bit lines BL2n+1 and BL2n+3.

Read operation and write operation of the memory array arrangement of FIG. 3 are similar to those of the memory array arrangement of FIG. 4 and will not be described in detail.

Erase operation in the memory array arrangement of FIG. 3 will be described with reference to FIG. 2. Note that, as in the first embodiment, it is assumed that an erase voltage is applied to two bit lines in each erase voltage applying step. It is also assumed that the erase operation is executed with respect to the usable region 105.

Initially, before start of erasure, write operation is executed with respect to data in the erased state within an erase unit to provide a uniform Vt within the erase unit (preprogramming step (pre-erasure write operation)). In this case, the write operation is executed with respect to not only data in the memory cells 101 of the usable region 105, but also data on the BL2n+2 side of the memory cells 101 between the bit lines BL2n+1 and BL2n+2 and data on the BL2n+2 side of the memory cells 101 between the bit line BL2n+2 and BL2n+3 in the isolation region 206. The write operation is executed via the main bit line MBLn in the usable region 105 and the main bit line MBLn+1 in the isolation region 206.

The following erase operation is similar to that of the first embodiment. Initially, a word line selecting circuit 112 applies an erase voltage Vwle to word lines 102 (WL0 to WLm). Erase voltage applying steps E_0 to E_n are executed. Thereafter, erasure verification is executed to determine whether or not a predetermined Vt has been reached. When the predetermined Vt has not been reached, the erase voltage applying steps E_0 to E_n are executed again. When the predetermined Vt has been reached, the erase voltage application is stopped. Thus, the erase operation is completed.

Here, also in this embodiment, as in the first embodiment, in step E_n, when the erase voltage is applied to the bit line BL2n of the usable region 105, the erase voltage is also simultaneously applied to the bit line BL2n+2 of the isolation region 206. Therefore, in each of the erase voltage applying steps E_0 to E_n, the erase voltage is applied to two bit lines (i.e., a constant number of bit lines).

Also, in the preprogramming step, write operation is executed with respect to bits on the bit line 2n+2 side of the memory cells 101 connected to the bit lines BL2n+2 of the isolation region 206 selected in step E_n. As a result, an erase current in step E_n can be caused to be closer to 2Ie, thereby more efficiently suppressing variations in erase voltage applied to each bit line.

Although it has been assumed in each embodiment above that the number of bit lines to which an erase voltage is simultaneously applied is two, this number may be more than two. Even if so, an arrangement and operation similar to those of each embodiment can be achieved. Specifically, the number of bit lines to which an erase voltage can be applied is increased in an isolation region. In addition, an erase voltage may also be applied to a bit line of an isolation region in at least one erase voltage applying step so that the erase voltage is applied to a constant number of bit lines in each erase voltage applying step. As a result, an effect similar to that of each embodiment can be obtained.

According to the present disclosure, variations in voltage applied to a bit line in each erase voltage applying step can be suppressed, thereby avoiding a problem, such as occurrence of over-erasure or the like. As a result, variations in Vt after erasure can be reduced. Therefore, the present disclosure is useful for an improvement in reliability of a non-volatile semiconductor memory device.

What is claimed is:

1. A non-volatile semiconductor memory device comprising:
    a memory array which includes:
        a plurality of non-volatile memory cells arranged in an array extending in X and Y directions, for storing data by locally accumulating electric charge;
        a plurality of word lines extending in the X direction in a region where the plurality of non-volatile memory cells are provided; and
        a plurality of bit lines and a plurality of main bit lines extending in the Y direction in the region where the plurality of non-volatile memory cells are provided, wherein:
    the memory array includes one or more usable regions which can store data, and one or more isolation regions which cannot store data,
    the one or more isolation regions are arranged in parallel to a bit-line direction, isolating the one or more usable regions from each other,
    the plurality of bit lines and the plurality of main bit lines are provided in the one or more usable regions,
    each of the plurality of bit lines is connected via a first select transistor to a corresponding one of the plurality of main bit lines,
    a first isolation region bit line is provided in the one or more isolation regions, and
    at least a first main bit line of the plurality of main bit lines is connected via a corresponding first select transistor to the first isolation region bit line in addition to a corresponding one of the plurality of bit lines provided in the one or more usable regions.

2. The non-volatile semiconductor memory device of claim 1, wherein
    erase operation of the one or more usable regions includes an erase voltage applying step of applying a voltage to the plurality of bit lines, and an erasure verifying step of verifying that a desired erased state is achieved, after the erase voltage applying step,
    the erase voltage applying step includes executing simultaneous application of the voltage to two or more of the plurality of bit lines a plurality of times while changing the applied bit line, and
    at least one of the plurality of times of the voltage application is to apply the voltage to the first isolation region bit line in addition to the corresponding one of the bit lines provided in the one or more usable regions.

3. The non-volatile semiconductor memory device of claim 1, wherein:
    a second isolation region bit line and a third isolation region bit line are provided in the one or more isolation regions, and connected to memory cells and to the first isolation region bit line, and
    the second isolation region bit line and the third isolation region bit line are connected, via second select transistors, to a second main bit line.

4. The non-volatile semiconductor memory device of claim 3, wherein
    erase operation of the usable region includes an erase voltage applying step of applying a voltage to the plurality of bit lines provided in the one or more usable regions, and an erasure verifying step of verifying that a desired erased state is achieved, after the erase voltage applying step,
    the erase operation of the one or more usable regions further includes executing a pre-erasure write operation with respect to an erased memory cell before executing the erase voltage applying step, and
    the pre-erasure write operation is executed with respect to a plurality of memory cells connected to the first isolation region bit line of the one or more isolation regions in addition to the memory cells of the one or more usable regions.

5. The non-volatile semiconductor memory device of claim 1, wherein:
    the plurality of non-volatile memory cells are of a MONOS type, and are arranged using a virtual ground,
    a first usable region memory cell and a first isolation region memory cell are provided at a boundary between one of the one or more usable regions and one of the one or more isolation regions,
    the first usable region memory cell and the first isolation region memory cell are connected to a first usable region bit line,
    the first usable region bit line is connected via a third select transistor to the first main bit line, and
    the first isolation region bit line is the other bit line of a second isolation region memory cell which shares an isolation region bit line with the first isolation region memory cell.

6. The non-volatile semiconductor memory device of claim 5, wherein:
    erase operation of the one or more usable regions includes an erase voltage applying step of applying a voltage to the plurality of bit lines provided in the one or more usable regions, and an erasure verifying step of verifying that a desired erased state is achieved, after the erase voltage applying step,
    the erase voltage applying step includes executing simultaneous application of the voltage to two or more bit lines of the plurality of bit lines a plurality of times while changing the applied bit line, and
    of the plurality of times of the voltage application, when the voltage is applied to the first usable region bit line, the voltage is applied to the first isolation region bit line.

7. The non-volatile semiconductor memory device of claim 5, wherein
    a second isolation region bit line and a third isolation region bit line are provided in the one or more isolation regions and connected to memory cells and to the first isolation region bit line, and the second isolation region bit line and a third isolation region bit line are connected, via fourth select transistors, to a second main bit line.

8. The non-volatile semiconductor memory device of claim 7, wherein:
erase operation of the one or more usable regions includes an erase voltage applying step of applying a voltage to the plurality of bit lines provided in the one or more usable regions, and an erasure verifying step of verifying that a desired erased state is achieved, after the erase voltage applying step,
the erase operation of the one or more usable regions further includes executing a pre-erasure write operation with respect to an erased memory cell before executing the erase voltage applying step, and
the pre-erasure write operation is executed with respect to a plurality of memory cells connected to the first isolation region bit line of the isolation region in addition to the memory cells of the one or more usable regions.

* * * * *